(12) United States Patent
Ouellet

(10) Patent No.: US 7,037,745 B2
(45) Date of Patent: May 2, 2006

(54) METHOD OF MAKING ELECTRICAL CONNECTIONS TO HERMETICALLY SEALED MEMS DEVICES

(75) Inventor: Luc Ouellet, Granby (CA)

(73) Assignee: DALSA Semiconductor Inc., Waterloo (CA)

( * ) Notice: Subject to any disclaimer, the term of this patent is extended or adjusted under 35 U.S.C. 154(b) by 22 days.

(21) Appl. No.: 10/839,130

(22) Filed: May 6, 2004

(65) Prior Publication Data

US 2005/0250238 A1    Nov. 10, 2005

(51) Int. Cl.
*H01L 21/00* (2006.01)
(52) U.S. Cl. .................. 438/53; 438/71; 438/121; 257/684
(58) Field of Classification Search .................. 438/53, 438/71, 78, 81, 121; 257/684, 688
See application file for complete search history.

(56) References Cited

U.S. PATENT DOCUMENTS

| | | | |
|---|---|---|---|
| 6,121,552 A * | 9/2000 | Brosnihan et al. | 174/253 |
| 6,777,263 B1 * | 8/2004 | Gan et al. | 438/106 |
| 2003/0161576 A1 * | 8/2003 | Blair et al. | 385/18 |
| 2003/0190776 A1 * | 10/2003 | Wong et al. | 438/200 |

* cited by examiner

*Primary Examiner*—Caridad Everhart
(74) *Attorney, Agent, or Firm*—Marks & Clerk; Richard J. Mitchell

(57) ABSTRACT

In the manufacture of a MEMS device having a semiconductor-on-insulator substrate with a first portion closed by a lid to provide a hermetically sealed region and an second portion external to said hermetically sealed region, a method of providing electrical connections to said hermetically sealed region comprising forming at least one continuous deep trench in said semiconductor and extending down to said insulator, said at least one deep trench surrounding and isolating at least one block of semiconductor within said substrate, and said at least one block of semiconductor extending form within said first region to said second region; depositing an insulating layer in said trenches and over the surface of said substrate; depositing a metal ring around said first region; sealing said lid to said metal ring; and attaching a contact to said at least one block of semiconductor in said second region to provide one or more electrical connections through said at least one block of semiconductor to one or more components of said MEMS device within said hermetically sealed ring.

23 Claims, 4 Drawing Sheets

METHOD OF MAKING ELECTRICAL CONNECTIONS TO HERMETICALLY SEALED MEMS DEVICES

FIELD OF THE INVENTION

This invention relates to the field of micro-electromechanical systems (MEMS), and in particular to a method of making electrical connections to hermetically sealed MEMS devices.

BACKGROUND OF THE INVENTION

MEMS devices are used for numerous applications where it is required to have moving parts located within a sealed cavity. It is known to make such devices by providing a base which consists of an etched SOI (silicon-on-insulator) substrate. A lid is then applied to the base to make a hermetically sealed device with a cavity inside. A typical example of such a device is an RF MEMS device. The Q-factor of such a device will degrade as the pressure within the sealed cavity rises above 10 Pascals due to leakage.

Some way must be found to provide an effective seal between the base, also known as the wafer level package, and the lid. It is known to provide a sealing ring in the form of a glass frit ring extending around the cavity portion of the package and hermetically seal the lid to the frit ring. In order to provide the necessary lateral seal, the frit must be in the order of 1 mm wide. This width limits the number of devices that can be made on one wafer, and hence determines the cost of the device.

In order to reduce the width of the sealing ring, it has been proposed to replace the glass frit ring with a metal sealing ring. The metal ring has the advantage that it is highly impermeable and thus enables the width of the sealing ring to be substantially reduced. Typically, with a metal ring present the sealing ring can be reduced from 1 mm to about 40 μm. The problem, however, is that if a metal ring is used as part of the sealing ring, it is not easy to take the necessary electrical leads outside the sealed cavity because if they are laid on top of the substrate they will be shorted by the metal ring.

SUMMARY OF THE INVENTION

The invention offers a solution to the above problem of taking electrical leads under the metal ring by isolating blocks of silicon or substrate material that extend from within the sealed portion of the base to the exterior portion and which are insulated from the sealing ring extending around the hermetically sealed portion of the device.

Accordingly the present invention provides in the manufacture of a MEMS device having a semiconductor-on-insulator substrate with a first region closed by a lid to provide a hermetically sealed region and a second region external to said first region, a method of providing electrical connections to said first region comprising forming at least one continuous deep trench in said semiconductor and extending down to said insulator, said at least one deep trench surrounding and isolating at least one block of semiconductor within said substrate, and said at least one block of semiconductor extending from within said first region to said second region; depositing an insulating layer in said trenches and over the surface of said substrate; depositing a metal ring around said first region over said insulating layer; sealing said lid to said metal ring; and attaching a contact to said at least one block of semiconductor in said second region to provide one or more electrical connections through said at least one block of semiconductor to one or more components of said MEMS device within said first region.

In another aspect the invention provides a MEMS device having a semiconductor-on-insulator substrate with a first region closed by a lid to provide a hermetically sealed region and an second region external to said first region, said MEMS device comprising at least one continuous deep trench in said semiconductor and extending down to said insulator, said at least one deep trench surrounding and isolating at least one block of semiconductor within said substrate, and said at least one block of semiconductor extending from within said first region to said second region; an insulating layer filling in said trenches and extending over at least part of the surface of said substrate; a metal ring extending around said first region over said insulating layer; said lid sealed to said metal ring; and a contact attached to said at least one block of semiconductor in said second region to provide one or more electrical connections through said at least one block of semiconductor to one or more components of said MEMS device within said first region.

The substrate is preferably silicon-on-insulator and the insulating layer is preferably low stress silicon nitride having a mechanical stress of less than 250 megapascals), or a mixture of silicon nitride and silicon.

Silicon nitride provides an excellent barrier against hydrogen, and water vapor. Low stress silicon nitride, less than 250 megapascals, has excellent conformability. Silicon oxides can be employed as the insulating layer, but these are prone to hydrogen permeation and do not work as well as silicon nitride.

The silicon nitride may deposited by reacting $SiCl_2H_2$ with $NH_3$ at a ratio of $SiCl_2H_2$ to $NH_3$ of between 4 and 7 to 1 at a temperature between 800 and 850° C. and a pressure between 400 mTorr and 1 Torr. These conditions result in low stress silicon nitride. The deposition of low stress silicon nitride is reported in the literature, for example, from U.C. Berkeley.

Practice of the invention only requires four masks (excluding the alignment mask required on the back side for lid wafer alignment). This makes the process economical to operate since the number of mask operations is critical to the viability of a commercial process.

BRIEF DESCRIPTION OF THE DRAWINGS

The invention will now be described in more detail, by way of example only, with reference to the accompanying drawings, in which.

DETAILED DESCRIPTION OF THE PREFERRED EMBODIMENTS

The invention will be described with reference to an RF MEMS device, although it will be understood that it is applicable to any MEMS device having a hermetically sealed wafer level package region requiring external electrical connections to the interior components of the wafer level package. The internal components of the MEMS device will not be shown since they are not relevant to the invention.

Figure 1:
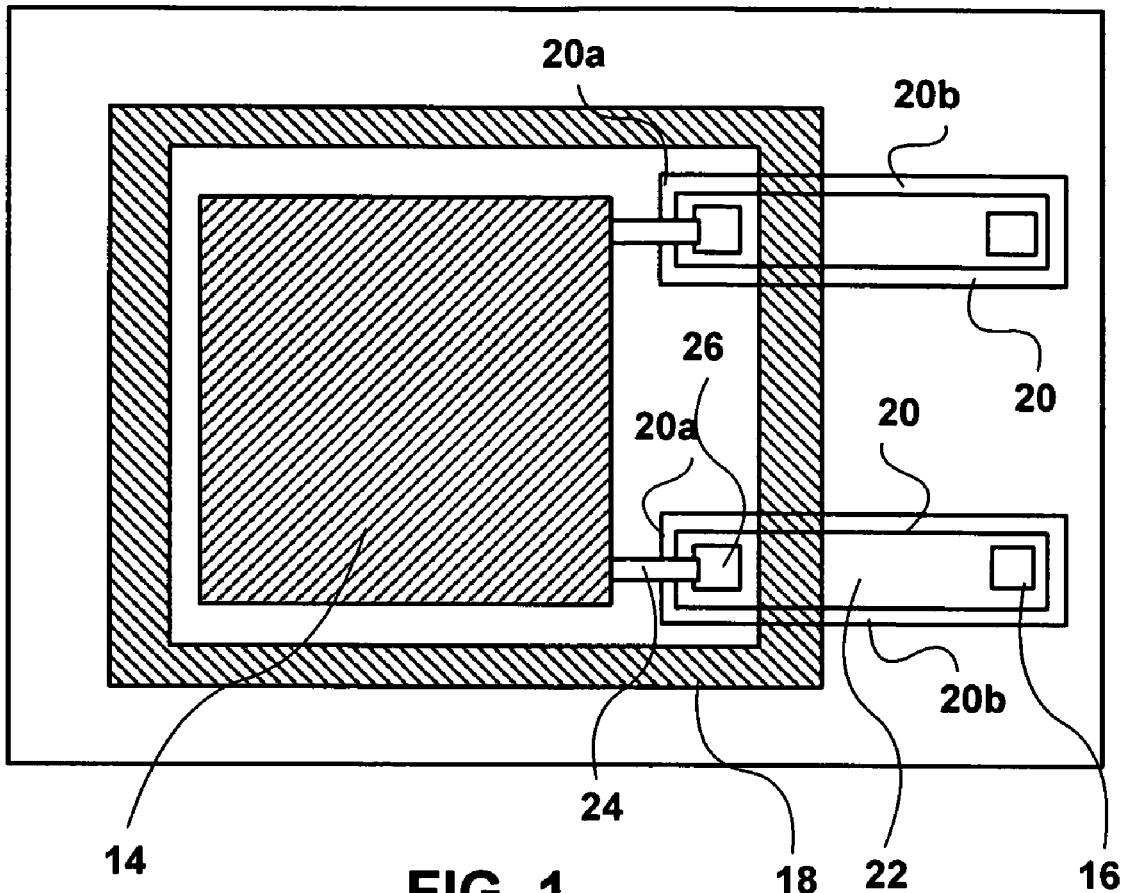
FIG. 1 is a plan view of a complete wafer level package with external connections.

The MEMS device in accordance with one embodiment of the invention shown in FIG. 1 comprises a silicon substrate 10 on an underlying $SiO_2$ insulator 12 (FIG. 2), an active wafer level package region containing active components 14, and external contact aluminum contact pads 16 on the substrate 10 and outside the wafer level package, which is defined by a metal sealing ring 18.

The metal sealing ring 18 is made of a solderable alloy, such as an Ni/Pd alloy, and is used in a manner known per se to hermetically seal the wafer level package to the lid and thus provide a hermetically sealed cavity. The use of a metal sealing ring permits the width of the sealing ring to be reduced to about 40 μm as compared to about 1 mm for a glass frit ring. This is very important because it permits a significant increase the packing density of the devices on a wafer. Clearly, the more devices that can be accommodated on a wafer, the more economical is the process.

The ring 18 is referred to as a ring because it surrounds the active components, although it will be understood that it does not have do be circular, and in this embodiment the ring 18 is in fact rectangular.

For proper functioning of the device, electrical connections must be made from the active components 14 to the contact pads 16. Metal leads cannot be deposited on the substrate surface because these would be shorted by the metal ring 18, which overlies them. Attempts to place an insulating layer over the metal leads fail because they disrupt the smoothness of the surface and make it very difficult to obtain a satisfactory hermetic seal.

In the illustrated embodiment, the silicon block 22 is isolated from the active components 14 by an end trench 20a. In order to connect the silicon block 20 to the active components 14, a deposited Al bridge 24 acts as a jumper extending over the end trench 20a. The jumper is connected to a contact pad 26 deposited on the silicon black 20. Thus, an electrical connection is provided from the active components 14 through the jumper 24 and contact pad 26 to the silicon block 20, under the metal ring 18, which is insulated from the surface of the silicon by a deposited nitride layer, to the contact pad 16 for connection to the external components.

In the illustrated embodiment, the silicon block 22 is isolated from the active components 14 by an end trench 20a. In order to connect the silicon block 20 to the active components 14, a deposited Al bridge 24 acts as a jumper extending over the end trench 20a. The jumper is connected to a contact pad 26 deposited on the silicon black 20. Thus, an electrical connection is provided from the active components 14 through the jumper 16 and contact pad 26 to the silicon block 20, under the metal ring 18, which is insulated from the surface of the silicon by a deposited nitride layer, to the contact pad 16 for connection to the external components.

Depending on the nature of the active components 14, it is possible to dispense with the end trench 20a and jumper 24, and extend the side trenches 20b to the active components 14, in which case the active components can make direct contact with the silicon blocks 22 on each side of the device. The cavity accommodating the active components can isolate the extended blocks 20 from each other and from the rest of the substrate.

The silicon 10 on the silicon-on-insulator substrate is typically 15 μm thick. The embedded oxide 12 is typically 2 μm thick. The trenches forming the blocks of silicon are preferably formed with a reactive ion etch.

The metal ring is preferably made by depositing a metal seed layer, which is then this is covered with nickel or and allow of nickel and palladium. The lid typically incorporates the solder that is soldered to the thus deposited metal ring.

EXAMPLE

Figure 2:
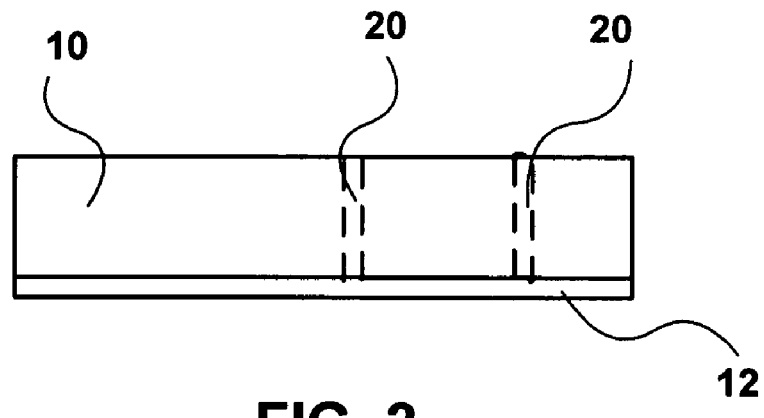
FIG. 2 is a cross sectional view of part of the silicon-on-insulator wafer.

The device shown in FIG. 1 was fabricated from a block of SOI silicon substrate as shown in FIG. 2. The wafer had the following characteristics: a diameter of 150±0.2 mm, orientation <100>, resistivity <0.05 Ω.cm (B-doped), silicon thickness 15±1.0 μm, and underlying oxide thickness 2.0±0.20 μm.

Figure 3:
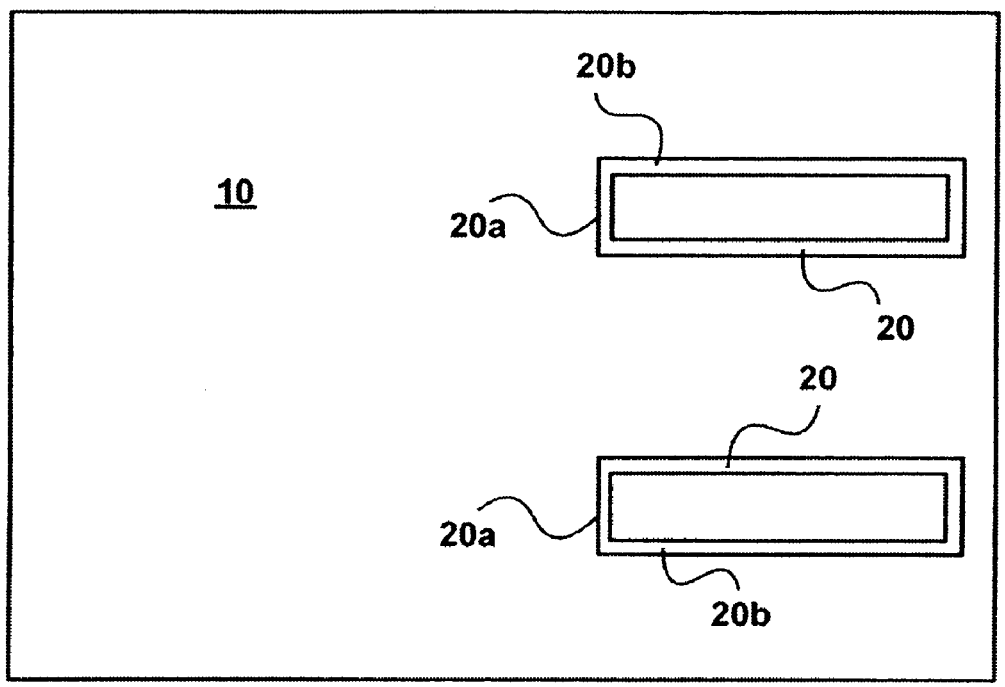
FIG. 3 is a plan view of the substrate showing the formation of the trenches.

First, as shown in FIG. 3, a 15 μm deep reactive ion etch (DRIE) with a 3.0 μm over etch was performed to produce the trenches 20. The DRIE produced a 0.25 μm footing into the underlying oxide layer 12. The trenches 20 generally isolate rectangular blocks of silicon 22.

Next, a silicon nitride layer, which was 0.9 μm±0.09 μm thick, was deposited on the whole of the top surface of the wafer by Low Pressure Chemical Vapor Deposition (LPCVD). In this example, the silicon nitride layer had a mechanical stress of 175±50 MPa, but it should in any event be kept below 250 MPa. The silicon nitride layer extends into the trenches 20 and as it builds up on the walls, it pinches the trenches off in the middle to seal them since the trenches are only 1.00±0.2 μm wide.

Figure 4:
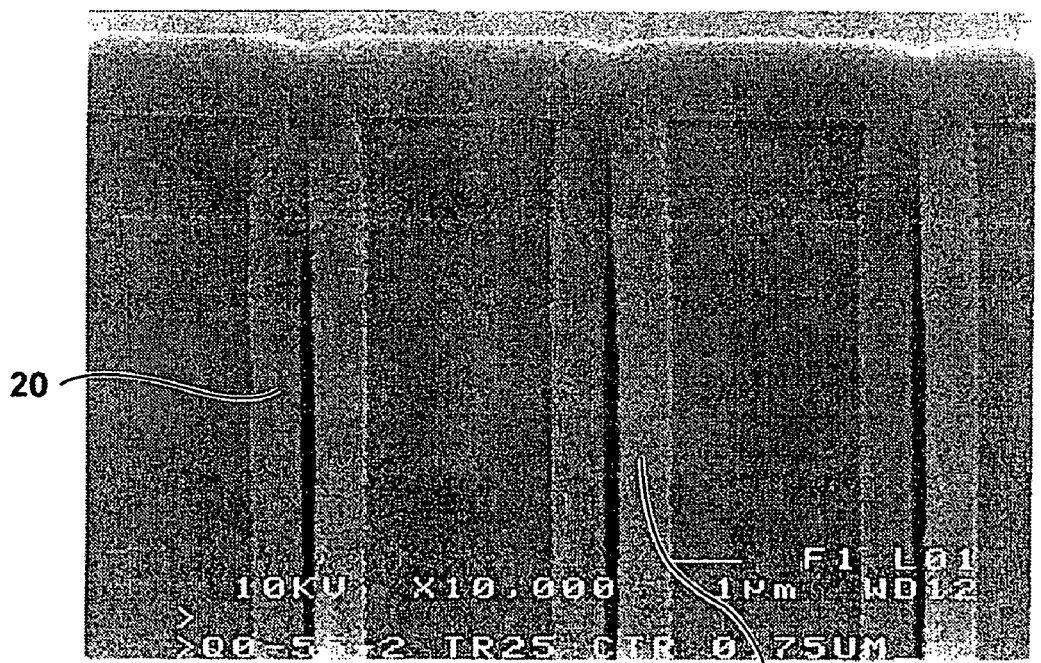
FIG. 4 is a microphotograph showing the filling of the trenches with silicon nitride.

FIG. 4 shows the silicon nitride layer 28 filling the trenches 20, and in particular how the walls come together to pinch off the gap between them as the nitride layer is deposited.

Figure 5:
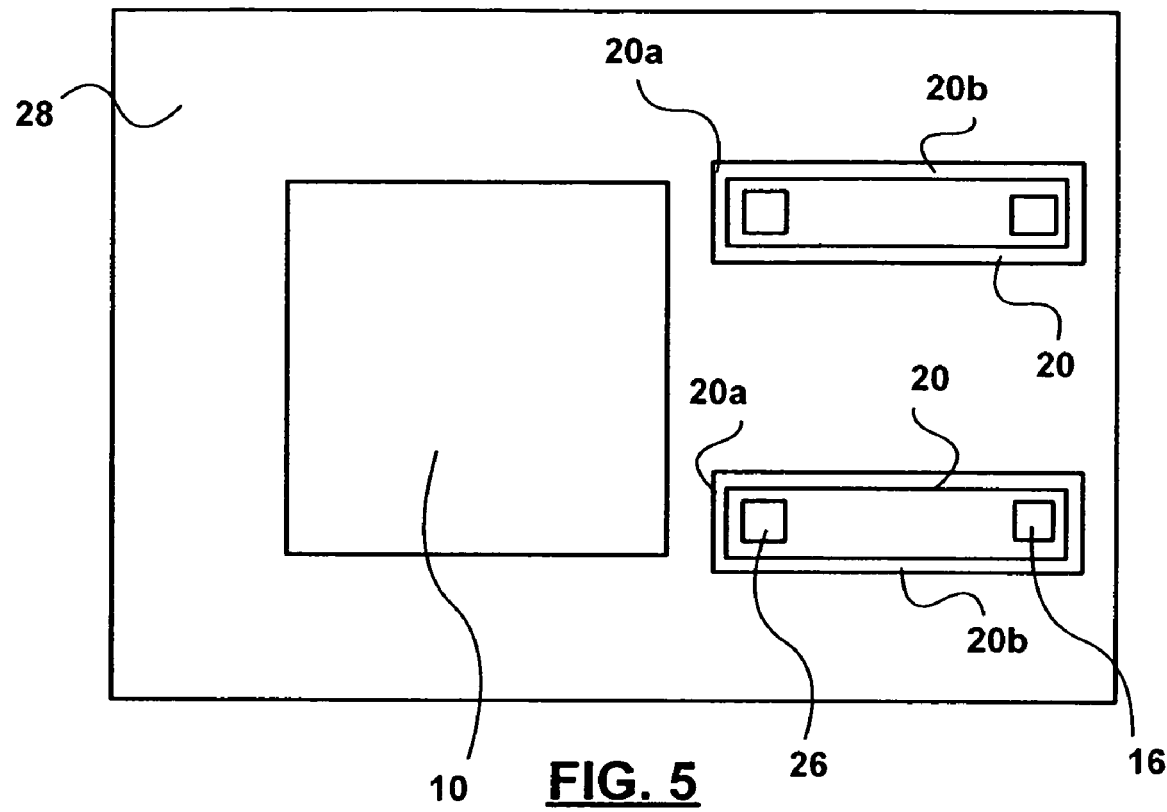
FIG. 5 shows the patterning of the silicon nitride layer.

The next step, shown in FIG. 5, is to pattern the nitride layer 28 in the region of the active components and the region of the contact pads 16, 26 to expose the underlying silicon substrate 10.

Figure 6:
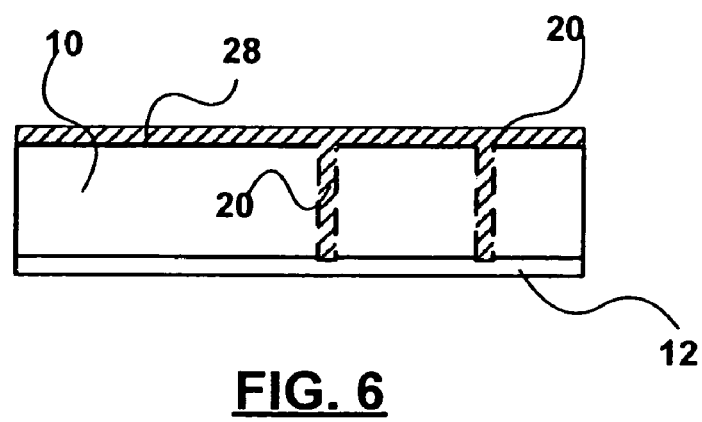
FIG. 6 is a cross sectional view showing the silicon nitride layer.

The next step, shown in FIG. 6, is to deposit the interconnects and the underlay for the metal sealing ring. First an aluminum layer 30 of 0.80±0.08 μm thickness is deposited on the patterned silicon nitride layer. This aluminum layer is then patterned to produce the underlayer 18a for metal ring 18, the contact pads 16, 26, and in this embodiment the jumpers 24, it being noted that these latter components can be, and in the preferred embodiment are, omitted.

Figure 7:
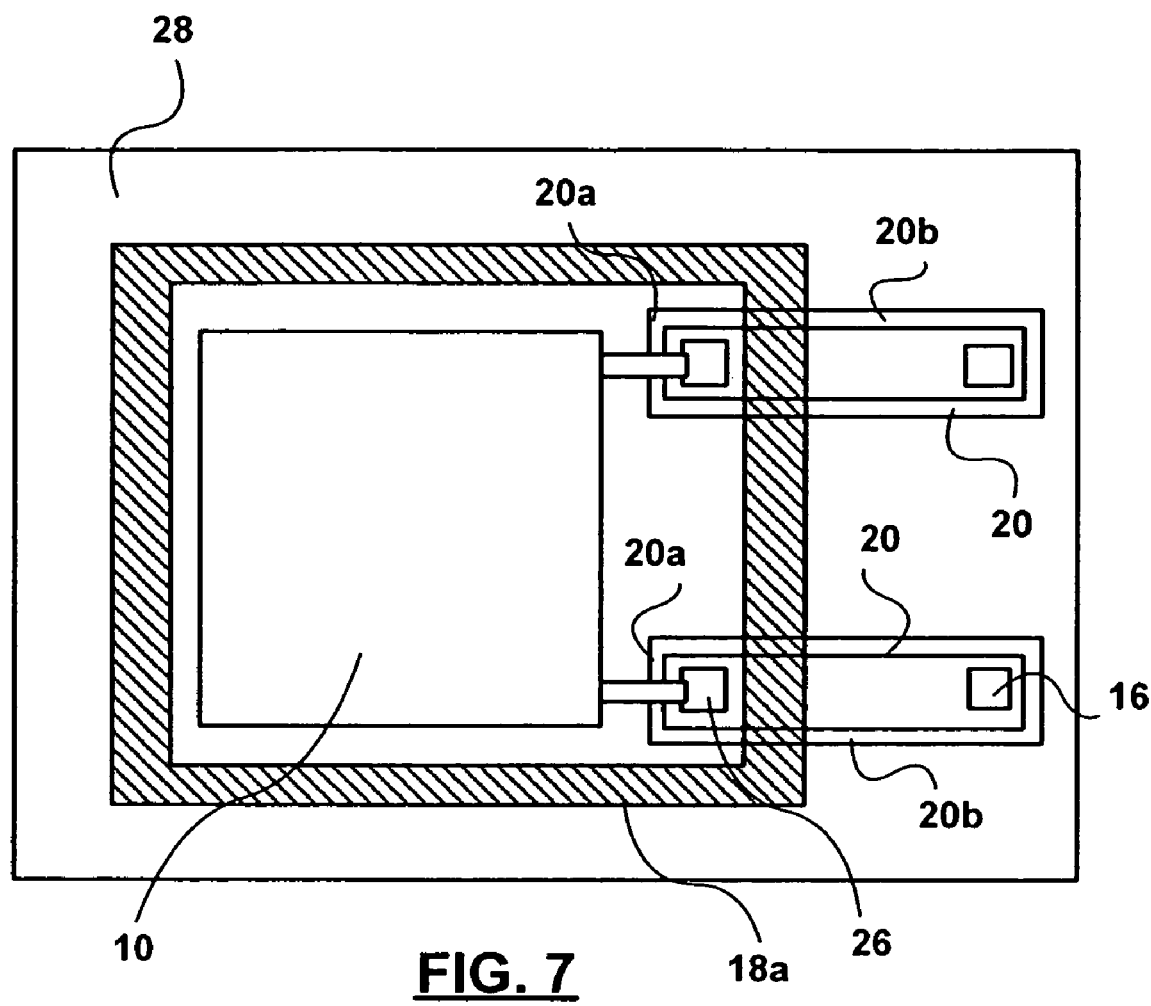
FIG. 7 shows the deposition of patterned aluminum layer.

After patterning the aluminum layer, an Ni/Pd, or other solderable metal, layer is deposited on the Al seed layer as shown in FIG. 7 to form the metal ring 18 and contact pads 26 for the jumpers 24 where such contact pads are present.

The active components 14 can then be formed in a conventional manner by performing a deep reactive ion etch into the silicon substrate that is exposed through the patterned silicon nitride layer 28.

Finally, the wafer lid can be applied to the wafer level package by bonding in a conventional manner. While the metal ring 18 permits a substantial reduction in the width of the sealing ring, it does not short the leads formed by the silicon blocks since the silicon nitride layer isolates the silicon from the overlying metal ring. It is not necessary to pass metal leads, which would disrupt the hermetic seal, under the metal ring 18. As a result a tight durable seal can be formed.

It will thus be seen as illustrated more particularly in the attached drawings that by isolating blocks of silicon within the substrate it is possible to use these blocks as leads extending outside the hermetically sealed region. The insulating layer fills the trenches and is pinched at the top. The trenches are about 1 μm wide. Silicon nitride is highly conformal, which means it is deposited on the walls until they meet in the middle. Once the deposited layers meet in the middle, they form a seam, but the silicon nitride fills the whole trench, and as deposition continues it forms a capping layer on top of the filled trench. The silicon nitride layer is typically about 0.9 μm thick.

The invention permits the size of the device to be significantly reduced since not only does the reduced width of the sealing ring and elimination of the glass frit ring contribute to a reduction in size of the device, also the contacts pads 16 can be brought closer to the hermetically sealed package.

The invention claimed is:

1. In the manufacture of a MEMS device having a substrate comprising a semiconductor on an insulator, said substrate having a first region closed by a lid to provide a hermetically sealed region for containing active components of the MEMs device, and a second region outside said first region, a method of providing electrical connections between said first region and said second region, comprising:
    forming at least one continuous deep trench in said semiconductor and extending down to said insulator, said at least one deep trench surrounding and isolating at least one block of semiconductor within said substrate, and said at least one block of semiconductor extending from within said first region to said second region to provide an electrical path between said first region and said second region;
    depositing an insulating layer in said trenches and over the surface of said substrate;
    attaching a contact to said at least one block of semiconductor in said second region to provide electrical connections through said at least one block of semiconductor from said second region to one or more components of said MEMS device within said first region;
    depositing a metal ring around said first region over said insulating layer; and sealing said lid to said metal ring to provide said hermetically sealed first region within said metal ring.

2. The method of claim 1, wherein said insulating layer is a mixture of silicon nitride and silicon.

3. The method of claim 1, wherein said semiconductor is silicon.

4. The method of claim 1, wherein said at least one block of semiconductor extends continuously from said one or more components within said first region to said contact in said second region.

5. The method of claim 1, wherein said at least one trench is over-etched to provide footings into said insulator.

6. The method of claim 1, wherein said at least one trench surrounding said block of semiconductor merges into a cavity formed within said first region as part of said MEMS device.

7. The method of claim 1, wherein said metal ring includes an underlayer deposited directly onto said insulating layer.

8. The method as claimed in claim 1, wherein said underlayer is aluminum.

9. The method as claimed in claim 8, wherein said metal ring is an Ni/Pd alloy deposited on said underlayer.

10. The method of claim 1, wherein said insulating layer is silicon nitride.

11. The method of claim 10, wherein said silicon nitride has a tensile stress less than 250 MPa.

12. The method of claim 11, wherein said silicon nitride is deposited by low pressure chemical vapor deposition (LPCVD).

13. The method of claim 12, wherein said silicon nitride is deposited by reacting $SiCl_2H_2$ with $NH_3$ at a ratio of $SiCl_2H_2$ to $NH_3$ of between 4 and 7 to 1.

14. The method of claim 13, wherein said silicon nitride is deposited at a temperature between 800 and 850° C.

15. The method of claim 14, wherein said silicon nitride is deposited at a pressure between 400 mTorr and 1 Torr.

16. A MEMS device having a substrate comprising a semiconductor on an insulator, said substrate having a first region closed by a lid to provide a hermetically sealed region and a second region outside said first region, said MEMS device comprising:
    at least one continuous deep trench in said semiconductor and extending down to said insulator, said at least one deep trench surrounding and isolating at least one block of semiconductor within said substrate, and said at least one block of semiconductor extending from within said first region to said second region to provide an electrical path between said first region and said second region;
    an insulating layer filling in said trenches and extending over at least part of the surface of said substrate;
    a metal ring extending around said first region over said insulating layer;
    said lid sealed to said metal ring to define said hermetically sealed first region within said metal ring; and
    a contact attached to said at least one block of semiconductor in said second region to provide electrical connections through said at least one block of semiconductor to one or mare components of said MEMS device within said first region.

17. The device of claim 16, wherein said at least one trench merges with a cavity formed within said first region and forming an active part of the MEMS device.

18. The device of claim 16, wherein said at least one block has a rectangular configuration.

19. The device of claim 16, wherein said semiconductor is silicon and said insulating layer is silicon nitride.

20. The device of claim 19, wherein said at least one block extends continuously from said one or more components to said contact.

21. The device of claim 16, wherein said metal ring includes an underlayer deposited directly on said insulating layer.

22. The device of claim 21, wherein said underlayer is aluminum.

23. The device of claim 22, wherein said metal ring is an Ni/Pd alloy.

* * * * *